(12) United States Patent
Steele et al.

(10) Patent No.: US 9,366,702 B2
(45) Date of Patent: Jun. 14, 2016

(54) DEVICES AND METHODS FOR DETERMINING WHETHER AN ELECTRICAL DEVICE OR COMPONENT CAN SUSTAIN VARIATIONS IN VOLTAGE

(71) Applicant: Green Edge Technologies, Inc., Poway, CA (US)

(72) Inventors: Scott A. Steele, Poway, CA (US); William P. Alberth, Jr., Prairie Grove, IL (US); David K. Hartsfield, Poway, CA (US)

(73) Assignee: Green Edge Technologies, Inc., Poway, CA (US)

( * ) Notice: Subject to any disclaimer, the term of this patent is extended or adjusted under 35 U.S.C. 154(b) by 460 days.

(21) Appl. No.: 13/974,784

(22) Filed: Aug. 23, 2013

(65) Prior Publication Data

US 2015/0057825 A1 Feb. 26, 2015

(51) Int. Cl.
*G01R 19/25* (2006.01)
*H02J 4/00* (2006.01)
(Continued)

(52) U.S. Cl.
CPC ............ *G01R 19/2513* (2013.01); *G01R 21/00* (2013.01); *H02J 3/14* (2013.01);
(Continued)

(58) Field of Classification Search
CPC ....... Y04S 20/14; Y04S 20/16; Y04S 20/222; Y04S 20/224; Y04S 20/225; Y04S 20/227; Y04S 20/228; Y04S 20/242; Y04S 20/221; Y04S 20/38; Y02B 70/3216; Y02B 70/3225; Y02B 70/3233; Y02B 70/3241; Y02B 70/325; Y02B 70/3266; Y02B 90/224; Y02B 90/226; H02J 3/14; H02J 2003/143; G01R 19/0092; G01R 21/00; G01R 19/2513; G06F 1/26; H04L 12/2803; H04L 2012/285; H04Q 2209/84; Y10T 307/826; G05F 1/66; G06Q 50/06

See application file for complete search history.

(56) References Cited

U.S. PATENT DOCUMENTS 5,552,694 A * 9/1996 Appeltans ............. H02M 3/157
  323/222
5,710,691 A * 1/1998 Fowler .................... H02H 3/42
  361/78

(Continued)

FOREIGN PATENT DOCUMENTS

EP          2 492 763 A1    8/2012
WO    WO 2012/018526 A1    2/2012

OTHER PUBLICATIONS

PCT Notification, mailed Feb. 18, 2014, of Transmittal of the International Search Report and the Written Opinion of the International Searching Authority, or the Declaration, for International Appln. No. PCT/US2013/068974, filed Nov. 7, 2013.

*Primary Examiner* — Crystal J Barnes-Bullock
(74) *Attorney, Agent, or Firm* — Bookoff McAndrews, PLLC

(57) ABSTRACT

A method of determining whether an electrical appliance can tolerate variations in supplied electrical energy. In some embodiments, the method may include coupling the electrical appliance to a source of electrical energy, delivering electrical energy to the electrical appliance, wherein the electrical energy is delivered at a first electrical energy level, obtaining a first measurement of current consumed by the electrical appliance at the first electrical energy level, delivering electrical energy to the electrical appliance at a second electrical energy level different than the first electrical energy level, obtaining a second measurement of current consumed by the electrical appliance at the second electrical energy level, and comparing the first measurement of current to the second measurement of current.

19 Claims, 7 Drawing Sheets

(51) Int. Cl.
   *G01R 21/00* (2006.01)
   *H04L 12/28* (2006.01)
   *H02J 3/14* (2006.01)

(52) U.S. Cl.
   CPC .............. *H02J 4/00* (2013.01); *H04L 12/2803* (2013.01); *H02J 2003/143* (2013.01); *H04L 2012/285* (2013.01); *Y02B 70/325* (2013.01); *Y02B 70/3216* (2013.01); *Y02B 70/3266* (2013.01); *Y04S 20/16* (2013.01); *Y04S 20/221* (2013.01); *Y04S 20/227* (2013.01); *Y04S 20/242* (2013.01); *Y04S 20/38* (2013.01)

(56) References Cited

U.S. PATENT DOCUMENTS

| | | |
|---|---|---|
| 5,760,558 A | 6/1998 | Popat |
| 5,877,957 A | 3/1999 | Bennett |
| 6,112,127 A | 8/2000 | Bennett |
| 6,385,495 B1 | 5/2002 | Bennett |
| 6,400,996 B1 | 6/2002 | Hoffberg et al. |
| 6,418,424 B1 | 7/2002 | Hoffberg et al. |
| 6,493,643 B1* | 12/2002 | Aisa ............... H02J 3/14 307/38 |
| 6,630,650 B2 | 10/2003 | Bassill et al. |
| 6,912,429 B1 | 6/2005 | Bilger |
| 6,965,205 B2 | 11/2005 | Piepgras et al. |
| 7,161,313 B2 | 1/2007 | Piepgras et al. |
| 7,336,192 B2 | 2/2008 | Aisa |
| 7,339,466 B2 | 3/2008 | Mansfield et al. |
| 7,406,353 B2 | 7/2008 | Bennett |
| 7,423,546 B1* | 9/2008 | Aisa ............... H02J 13/0086 340/635 |
| 7,480,746 B2 | 1/2009 | Simon et al. |
| 7,550,935 B2 | 6/2009 | Lys et al. |
| 7,763,994 B2* | 7/2010 | Inomoto ........... G06F 1/26 307/75 |
| 7,808,368 B2 | 10/2010 | Ebrom et al. |
| 7,813,831 B2 | 10/2010 | McCoy et al. |
| 7,831,321 B2 | 11/2010 | Ebrom et al. |
| 7,860,679 B2 | 12/2010 | Rouchier et al. |
| 7,865,252 B2 | 1/2011 | Clayton |
| 8,024,073 B2 | 9/2011 | Imes et al. |
| 8,027,752 B2 | 9/2011 | Castaldo et al. |
| 8,040,234 B2 | 10/2011 | Ebrom et al. |
| 8,078,318 B2* | 12/2011 | Kumazawa ........ G05B 19/4183 700/245 |
| 8,085,163 B1 | 12/2011 | Wells et al. |
| 8,094,034 B2 | 1/2012 | Patel et al. |
| 8,134,310 B2 | 3/2012 | Wacknov et al. |
| 8,183,995 B2 | 5/2012 | Wang et al. |
| 8,185,250 B2 | 5/2012 | Sato |
| 8,190,275 B2 | 5/2012 | Chang |
| 8,214,671 B2 | 7/2012 | Boss et al. |
| 8,217,781 B2 | 7/2012 | Ebrom et al. |
| 8,234,363 B1 | 7/2012 | Kuo |
| 8,237,586 B2* | 8/2012 | Chuang ............ H04Q 9/00 340/635 |
| 8,248,230 B2 | 8/2012 | Covaro et al. |
| 8,250,163 B2 | 8/2012 | Castaldo et al. |
| 8,255,090 B2 | 8/2012 | Frader-Thompson et al. |
| 8,334,784 B2 | 12/2012 | Patel et al. |
| 8,390,441 B2 | 3/2013 | Covaro et al. |
| 8,773,827 B2* | 7/2014 | Kiko ............... H01H 47/22 361/2 |
| 8,878,495 B2* | 11/2014 | Perisic ............. H01M 10/44 320/137 |
| 9,047,071 B2* | 6/2015 | Galsim ............. G06F 1/266 |
| 2002/0035404 A1 | 3/2002 | Ficco et al. |
| 2002/0080544 A1* | 6/2002 | Pellegrino ........ H02H 3/025 361/93.9 |
| 2002/0117497 A1 | 8/2002 | Bassill et al. |
| 2002/0149891 A1 | 10/2002 | Neiger et al. |
| 2003/0137258 A1 | 7/2003 | Piepgras et al. |
| 2003/0192881 A1 | 10/2003 | Bassill et al. |
| 2003/0197625 A1 | 10/2003 | Szuba |
| 2004/0138981 A1 | 7/2004 | Ehlers |
| 2005/0285547 A1 | 12/2005 | Piepgras et al. |
| 2007/0206375 A1 | 9/2007 | Piepgras et al. |
| 2007/0247134 A1* | 10/2007 | Ryan ............... H02J 13/001 323/318 |
| 2008/0105134 A1 | 5/2008 | Elston, III et al. |
| 2008/0108388 A1 | 5/2008 | Ebrom et al. |
| 2008/0122585 A1 | 5/2008 | Castaldo et al. |
| 2008/0122648 A1 | 5/2008 | Ebrom et al. |
| 2008/0123557 A1 | 5/2008 | Elston et al. |
| 2008/0125911 A1 | 5/2008 | Ebrom et al. |
| 2008/0125912 A1 | 5/2008 | Heilman et al. |
| 2008/0130520 A1 | 6/2008 | Ebrom et al. |
| 2008/0136581 A1 | 6/2008 | Heilman et al. |
| 2008/0140862 A1 | 6/2008 | Elston et al. |
| 2008/0143489 A1 | 6/2008 | Castaldo et al. |
| 2008/0143490 A1 | 6/2008 | Elston et al. |
| 2008/0143550 A1 | 6/2008 | Ebrom et al. |
| 2008/0157936 A1 | 7/2008 | Ebrom et al. |
| 2008/0223852 A1 | 9/2008 | Bassill et al. |
| 2008/0287121 A1 | 11/2008 | Ebrom et al. |
| 2009/0072985 A1 | 3/2009 | Patel et al. |
| 2009/0086387 A1 | 4/2009 | Engel |
| 2009/0100132 A1 | 4/2009 | Ebrom et al. |
| 2009/0100153 A1 | 4/2009 | Ebrom et al. |
| 2009/0195349 A1 | 8/2009 | Frader-Thompson et al. |
| 2010/0171430 A1 | 7/2010 | Seydoux |
| 2010/0188229 A1 | 7/2010 | Nhep |
| 2010/0237695 A1 | 9/2010 | Covaro et al. |
| 2010/0280667 A1 | 11/2010 | Steinberg |
| 2010/0305773 A1 | 12/2010 | Cohen |
| 2010/0328314 A1 | 12/2010 | Ellingham et al. |
| 2011/0090042 A1 | 4/2011 | Leonard et al. |
| 2011/0208369 A1* | 8/2011 | Yang .............. H02J 3/14 700/296 |
| 2011/0290787 A1 | 12/2011 | Bassill et al. |
| 2011/0313582 A1 | 12/2011 | Van Megen et al. |
| 2012/0104850 A1* | 5/2012 | Fallis .............. H02J 3/1864 307/31 |
| 2012/0173177 A1* | 7/2012 | Nishiyama ........ H02J 13/0017 702/62 |
| 2012/0303173 A1 | 11/2012 | Covaro et al. |
| 2012/0316808 A1 | 12/2012 | Frader-Thompson et al. |
| 2012/0323390 A1* | 12/2012 | Kobayasi ........ H02J 3/14 700/295 |
| 2013/0030732 A1 | 1/2013 | Shetty et al. |
| 2013/0154512 A1 | 6/2013 | Covaro et al. |
| 2014/0005853 A1* | 1/2014 | Chen ............... G01R 22/10 700/298 |
| 2014/0248802 A1* | 9/2014 | Hieda .............. H04L 12/2818 439/620.01 |
| 2014/0253102 A1* | 9/2014 | Wood .............. G01R 35/04 324/140 R |
| 2014/0371932 A1* | 12/2014 | Yang ............... G06Q 50/06 700/291 |
| 2015/0253364 A1* | 9/2015 | Hieda .............. H02J 3/00 702/62 |

\* cited by examiner

510 — With TRIAC off and with relay open measure delivered current and/or voltage.

520 — If current and/or voltage is non zero, then TRIAC may be failed on.

530 — Leave relay closed, notify controller that a failure has occurred.

DEVICES AND METHODS FOR DETERMINING WHETHER AN ELECTRICAL DEVICE OR COMPONENT CAN SUSTAIN VARIATIONS IN VOLTAGE

DESCRIPTION OF THE INVENTION

1. Field of the Invention

Embodiments of the present disclosure are generally directed to systems, devices, and methods for determining whether an electrical device or component may tolerate variances of supplied electrical energy without compromising desired performance. More particularly, embodiments of the present disclosure are directed to systems, devices, and methods for determining whether and electrical device (e.g., an electrical appliance) is capable of continuing operation within predetermined acceptable parameters when voltage supplied to the electrical device is adjusted (e.g., increased or reduced) during, e.g., a dimming function.

2. Background of the Invention

Certain electrical devices and/or components may be configured to operate at varying voltage levels. For example, an incandescent light bulb may have its brightness or intensity of light output varied by varying the amount of voltage supplied to the bulb. That is, reducing the voltage delivered to the bulb would result in reducing the amount of light emitted by the bulb. Those of ordinary skill in the art would understand such varying of voltage to be known as dimming. Benefits of dimming may include customization of, e.g., light output and energy efficiency.

While certain devices, such as the incandescent light bulb, may benefit from dimming, other electrical devices and components (including those having electrical motors, such as, e.g., vacuum cleaners) may experience failure or may overheat if voltage is varied or otherwise reduced during operation. For example, if the voltage supplied to an electrical motor is reduced by wave chopping, the motor may draw additional current, which would result in the motor overheating, which in turn may cause the motor to malfunction. Still further, while certain electrical devices or components may be capable of experiencing variations in voltage without compromising performance, those devices and components may not be suitable for dimming for one reason or another, including, for example, reasons associated with the device/component's purpose. For example, it may not be desirable to "dim" or otherwise vary the electrical energy (including, e.g., the voltage or current) supplied to refrigerators or cardiopulmonary bypass machines, or other devices having functions reliant on constant and/or high voltage.

Thus, there is a need to determine whether an electrical device component or device may be "dimmed" or otherwise sustain variations in supplied electrical without compromising performance.

SUMMARY OF THE INVENTION

The present disclosure is generally directed toward improving functionality of an automation system by enabling the system to determine if an electrical device/component can have the electrical power provided to it varied without comprising performance of the electrical device/component.

In one embodiment, a method of determining whether an electrical appliance can tolerate variations in supplied electrical energy is disclosed. In some embodiments, the method may include coupling the electrical appliance to a source of electrical energy, delivering electrical energy to the electrical appliance, wherein the electrical energy is delivered at a first electrical energy level, obtaining a first measurement of current consumed by the electrical appliance at the first electrical energy level, delivering electrical energy to the electrical appliance at a second electrical energy level different than the first electrical energy level, obtaining a second measurement of current consumed by the electrical appliance at the second electrical energy level, and comparing the first measurement of current to the second measurement of current.

Various embodiments of the method may include one or more of the following features: the second electrical energy level may be less than the first electrical energy level; comparing the first measurement of current to the second measurement of current may include determining whether the second measurement of current is greater or less than the first measurement of current; if the first current is substantially similar to the second current, reducing an electrical energy delivered to the electrical appliance; the source of electrical energy may include an electrical outlet including at least one TRIAC and relay; if the second current is less than first current, maintaining delivery of constant electrical energy to the electrical appliance; the electrical outlet may be in communication with an automation system, wherein the automation system may include a processor configured to perform the comparing; the automation system may include a memory configured to store information relating to whether the electrical appliance can operate with reduced electrical energy.

In another embodiment, a method of determining whether an electrical appliance can tolerate variations in supplied electrical energy may include coupling the electrical appliance to a source of electrical energy, delivering electrical energy to the electrical appliance, monitoring the electrical energy delivered to the electrical appliance, analyzing the electrical energy delivered to the electrical appliance to identify a current waveform and a voltage waveform, and analyzing the identified current and voltage waveforms.

Various embodiments of the method may include one or more of the following features: analyzing the identified current and voltage waveforms includes determining one of: (1) a power factor, (2) whether the current waveform leads the voltage waveform, and (3) whether the voltage waveform leads the current waveform; a power delivery device will reduce the electrical energy supplied to the appliance upon command, only if the analyzing has indicated that the appliance can operate with reduced electrical energy; if the power factor is below a predetermined threshold, reducing a voltage delivered to the electrical appliance; the predetermined threshold is 1.0; the predetermined threshold is 0.7; if the power factor is above a predetermined threshold, maintaining delivery of constant voltage to the electrical appliance; the electrical outlet is in communication with an automation system, wherein the automation system includes a processor configured to perform the analyzing steps.

In another embodiment, an automation system may include an electrical outlet, wherein the electrical outlet includes at least one sensor for measuring electrical energy supplied by the electrical outlet to an appliance, and wherein the electrical outlet is configured to vary a voltage supplied by the electrical outlet. The automation system may also include a controller having a processor including a memory, the controller being operably coupled to the electrical outlet; wherein the controller is configured to determine whether the appliance coupled to the outlet can tolerate variations in supplied electrical energy without compromising desired performance.

Various embodiments of the automation system may include one or more of the following features: determining whether the appliance coupled to the outlet can tolerate variations in supplied electrical energy without compromising desired performance comprises: measuring a first current consumed by the electrical appliance at the first electrical energy level; delivering electrical energy to the electrical applicant at a second level different than the first level; measuring a second current consumed by the electrical appliance at the second electrical energy level; and comparing the first current to the second current. In addition, the sensor may be a power meter. Still further, determining whether an appliance coupled to the outlet can tolerate variations in supplied electrical energy without compromising desired performance comprises: coupling the electrical appliance to a source of electrical energy; delivering electrical energy to the electrical appliance; monitoring the electrical energy delivered to the electrical appliance; analyzing the electrical energy delivered to the electrical appliance to identify a current waveform and a voltage waveform; and analyzing the identified current and voltage waveforms.

In at least one embodiment, the present disclosure includes an automation system, comprising a device, such as, e.g., an outlet for providing power to an electrical device or component (e.g., an electrical appliance). The outlet enables a person to connect and disconnect different appliances. Many devices such as HVAC systems are connected, e.g., directly, to electrical power by an electrician or someone else with expert knowledge on the appliance and the power requirements of the appliance. The system may further include a switch for controlling (e.g., permitting, terminating, and/or reducing without terminating) the supply of electrical power to the outlet and consequently to the electrical device/component connected to the outlet. In some embodiments, the outlet may further include a detector or other sensor capable of measuring a parameter of the power drawn by the electrical device or component. The parameter may include, but not limited to, voltage and/or current. In some embodiments, the system may be configured to make a determination based on the power drawn by the electrical device or component that the voltage supplied to the electrical device or component may be varied (e.g., dimmed) without adversely compromising the performance of the electrical device or component. Connecting an appliance to an outlet does not require expert knowledge and thus the automation system must determine the appropriate electrical energy to provide to the appliance and if the appliance can function properly if reduced electrical energy is provided during, e.g., a dimming function.

It may be understood that both the foregoing general description and the following detailed description are exemplary and explanatory only, and are not restrictive of the disclosure, as claimed. The present invention will be more clearly understood from the detailed description below in conjunction with the accompanying drawings.

BRIEF DESCRIPTION OF THE DRAWINGS

The accompanying drawings, which are incorporated in and constitute a part of this specification, illustrate exemplary embodiments of the present disclosure and together with the description, serve to explain the principles of the disclosure.

FIG. 5 depicts a flow diagram of another exemplary method, in accordance with an embodiment of the present disclosure.

DETAILED DESCRIPTION

Reference now will be made in detail to embodiments of the present disclosure, examples of which are illustrated in the accompanying drawings. Wherever possible, the same reference numbers will be used throughout the drawings to refer to the same or like parts and/or components.

Overview

An automation system, e.g., a home automation system, generally may include one or more switches and one or more outlets (or other suitable power delivery components), with the user desiring to control which outlet or outlets are controlled by each of the switch(es). Existing X10 devices require the user to manually set an address on the switch(es) and the outlet(s), wherein an outlet would respond to a switch with an identical address, e.g., the identically addressed switch may enable and/or disable power supplied by the outlet on command.

Embodiments of the present disclosure may include, among other things, an automation system. Examples of suitable systems include those described in U.S. application Ser. No. 13/672,534, filed Nov. 8, 2012, the entire disclosure of which is incorporated by reference herein. Systems according to the present disclosure may be used in, e.g., residential, commercial, and/or industrial structures. Non-limiting examples include single-family and multi-family dwellings, condominium units, apartments, apartment buildings, hospitals, nursing homes, prisons, cruise ships, offices, office buildings, schools, churches, sporting complexes, shopping centers, and manufacturing facilities.

Figure 1:
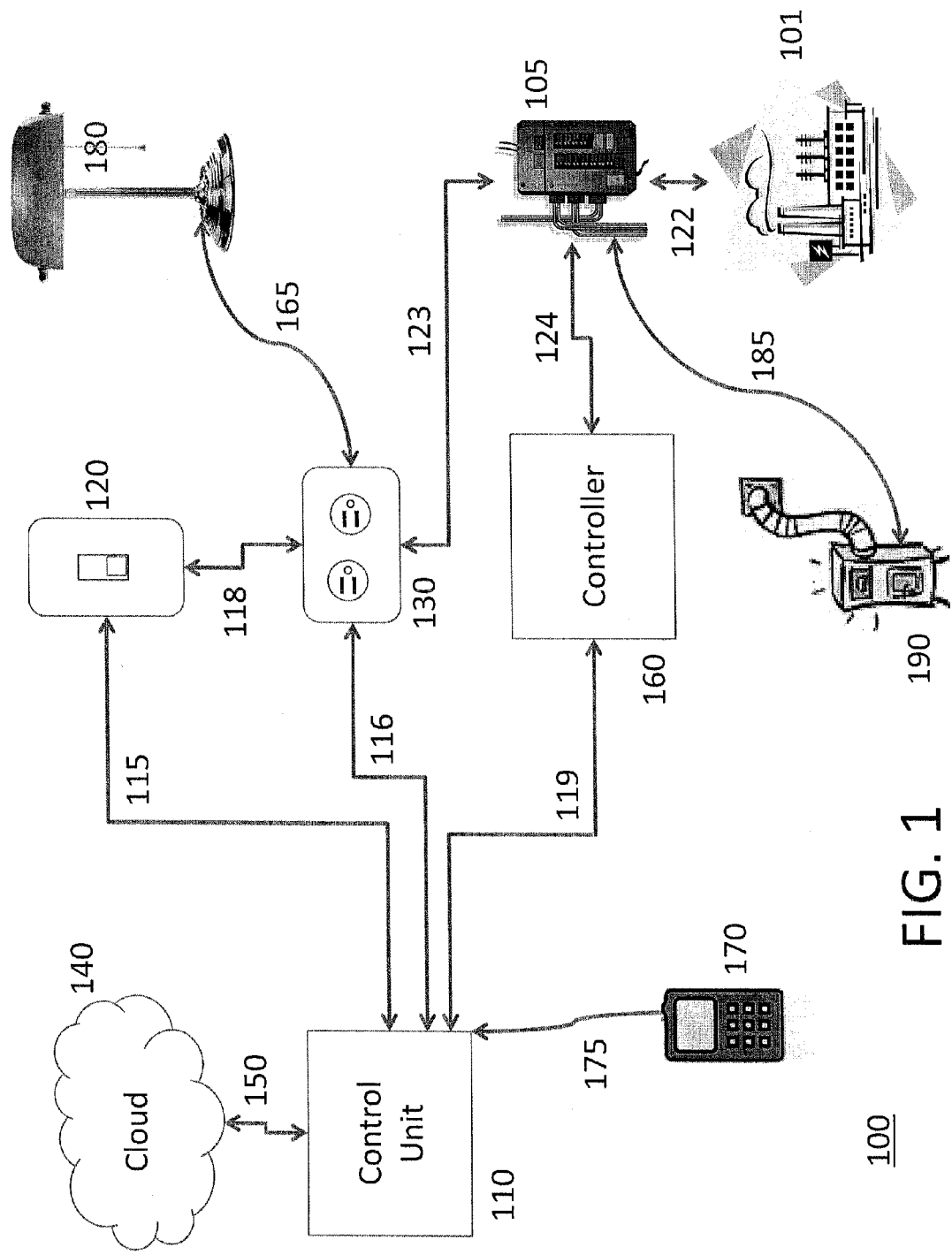
FIG. 1 schematically illustrates an exemplary automation system, in accordance with an embodiment of the present disclosure.

Embodiments of the present disclosure may be further understood with reference to FIGS. 1-7. In FIG. 1, for example, automation system 100 includes at least one outlet 130, which may be locally and/or remotely controlled. In some embodiments the outlet may be a junction box controlling appliances. The outlet 130 may be configured to monitor the power consumed by one or more devices (e.g., electrical appliances or components) connected thereto and/or to control power delivered by the outlet 130. The system 100 may further include a switch 120, which may send a signal (e.g., a wired or a wireless signal) to a control unit 110. The control unit 110 also may be locally or remotely controlled and may include, for example, a computer with a microprocessor, memory, and user interface. The control unit 110 may be a discrete control unit, such as, e.g., a laptop, desktop, tablet, or any other suitable device. The control unit 110 may be connected via wired or wireless network connection 150 to the Internet cloud 140, or any other electronic network. The control unit 110 also may be connected to the switch 120 via wired or wireless connection 115, and further connected to the outlet 130 via wired or wireless connection 116. Similarly, the switch 120 may be connected to the outlet 130 via wired or wireless connection 118.

The system 100 may include one or more other components or enhancements. Referring to FIG. 1, for example, the automation system 100 may include a controller 160 that can control (e.g., adjust, open, or close) physical structures, such as, e.g., window coverings. Controller 160 may be also configured to control other systems or enhancements associated with a home, office, school, or other structure discussed herein. For example, controller 160 may control systems for irrigation, heating, cooling, entertainment, and/or water heating. In addition, controller 160 may control one or more safety systems. In some embodiments, the controller 160 may receive instructions from the control unit 110 via wired or wireless connection 119. For example, the controller 160 may receive instructions from the control unit 110 for controlling window treatments.

The switch 120 may also communicate with the controller 160, outlet 130, and/or one or more other components of system 100 via wired or wireless means (not shown). The wired or wireless connections, for example connections 115, 116, 118, and 119, may use the same or different protocols or standards. In some embodiments, switch 120 may communicate with outlet 130 through one or more devices of the system 100. For example, switch 120 may communicate with a second outlet (not shown) or other component of the system 100 through control unit 110, e.g., switch 120 may send a signal to control unit 110, and control unit 110 may send a signal to the second outlet. In some embodiments, switch 120 may send a signal to outlet 130, which may send a signal to the second outlet, thereby permitting communication between switch 120 and the second outlet. Other components of system 100 may similarly relay and/or send messages on behalf of one component, e.g., a first component, to another component, e.g., a second component. This may be beneficial (in some cases required), such as if a direct communication path between the first and second components does not exist.

In addition to instructions being processed by control unit 110, some or all of the processing could be performed by one or more microprocessors included in the switch 120, the Internet cloud 140, or the outlet 130. It is understood that the system 100 may include multiple switches 120, outlets 130, and/or controllers 160, e.g., window control units. Other devices, such as sensors, may be in communication with the system 100 to provide information, including, e.g., temperature, light intensity, etc. In some embodiments, for example, the system may include or otherwise be in communication with a moisture sensor for providing information on the presence of water, e.g., humidity, rain, snow, or other precipitation. Each outlet 130, switch 120, control unit 110, and controller 160 may include one or more features of the outlet, switch, control, and controller, respectively, described in U.S. application Ser. No. 13/672,534, filed Nov. 8, 2012, which is incorporated herein by reference in its entirety.

A mobile device 170 may be wirelessly connected to the system 100 via wireless connection 175. For example, the mobile device 170 may be connected to the control unit 110 as shown in FIG. 1, and/or may be connected to the outlet 130, controller 160, switch 120, another device connected to the automation system 100, or any combinations thereof. The mobile device 170 may include a wireless transceiver, which provides means to measure received signal strength. The mobile device 170 may include any suitable means of collecting, recording, analyzing, and/or transmitting data in order to locate, characterize, and/or otherwise identify one or more devices or components of the automation system 100. In some embodiments, for example, the mobile device 170 may include a heat sensor and/or an RF sensor. Further, in some embodiments, the mobile device 170 may include an imaging device, e.g., a camera, for taking and transmitting pictures or other suitable images. The mobile device 170 may include means for determining location and/or orientation information. Non-limiting examples of such technology includes GPS, accelerometers, compasses, and gyroscopes. The mobile device 170 may collect data to determine the orientation of the camera when taking a picture, e.g., whether the camera is pointed towards a ceiling, a floor, or a wall. The geographic location and cardinal direction of the camera may also be determined via a compass, GPS, and/or other suitable data collected by the mobile device 170. In addition to instructions being processed by control unit 110, some or all of the processing could be performed by mobile device 170. Suitable methods of collecting and processing such information are described in U.S. application Ser. No. 13/766,123, filed Feb. 13, 2013, which is incorporated herein by reference in its entirety. In at least one embodiment, mobile device 170 may include a smartphone, which may have a touchscreen.

Further referring to FIG. 1, electrical energy or power may be generated at power plant 101, and transmitted to a home meter or breaker box 105 via, for example, wired transmission lines 122. The methods presently disclosed also may be applied to other utilities and/or alternative energy sources, such as, e.g., water, natural gas, steam, heat, solar, wind, geothermal, algal, biomass, or any other utility or resource. Further, the term "utilities," as used herein, is contemplated to include other services including, but not limited to, internet connections, data, voice, telecommunications, and/or broadcast services. Power may be routed to the outlet 130 by wires 123, and routed to controller 160 via wires 124. Power may be further routed to a heating ventilation and air conditioning (HVAC) system 190 via wire 185. It is also expected that power could be transmitted wirelessly and one or more of wires 122, 123, 124, and/or 185 could be replaced with wireless transmission methods. Each set of transmission wires, such as wires 123, may be referred to as a circuit. A circuit may, for example, be connected to and provide power to multiple devices, e.g., via multiple outlets 130. In some embodiments of the present disclosure, the system includes one or more circuits, e.g., circuit 123.

Breaker box 105 may measure voltage, current, and/or power on one or more power lines leading into and out of the breaker box 105. Breaker box 105 may, for example, include a utility meter. Breaker box 105 may be connected (e.g., wired or wirelessly) to automation system 100, and may include one or more sensors, such as voltage meters, current meters, temperature sensors, or other types of sensors. The sensor(s) may be connected (e.g., wired or wirelessly) to the automation system 100.

An appliance 180 such as, e.g., a desk lamp, may be plugged into or otherwise operably coupled to an outlet 130 or other suitable power delivery component through connection 165, which may be wired or wireless. The appliance 180 may be able to communicate with system 100 and/or another entity or component of automation system 100 or coupled to automation system 100, and the appliance 180 may have the ability to measure the amount of power drawn from outlet 130.

Figure 2:
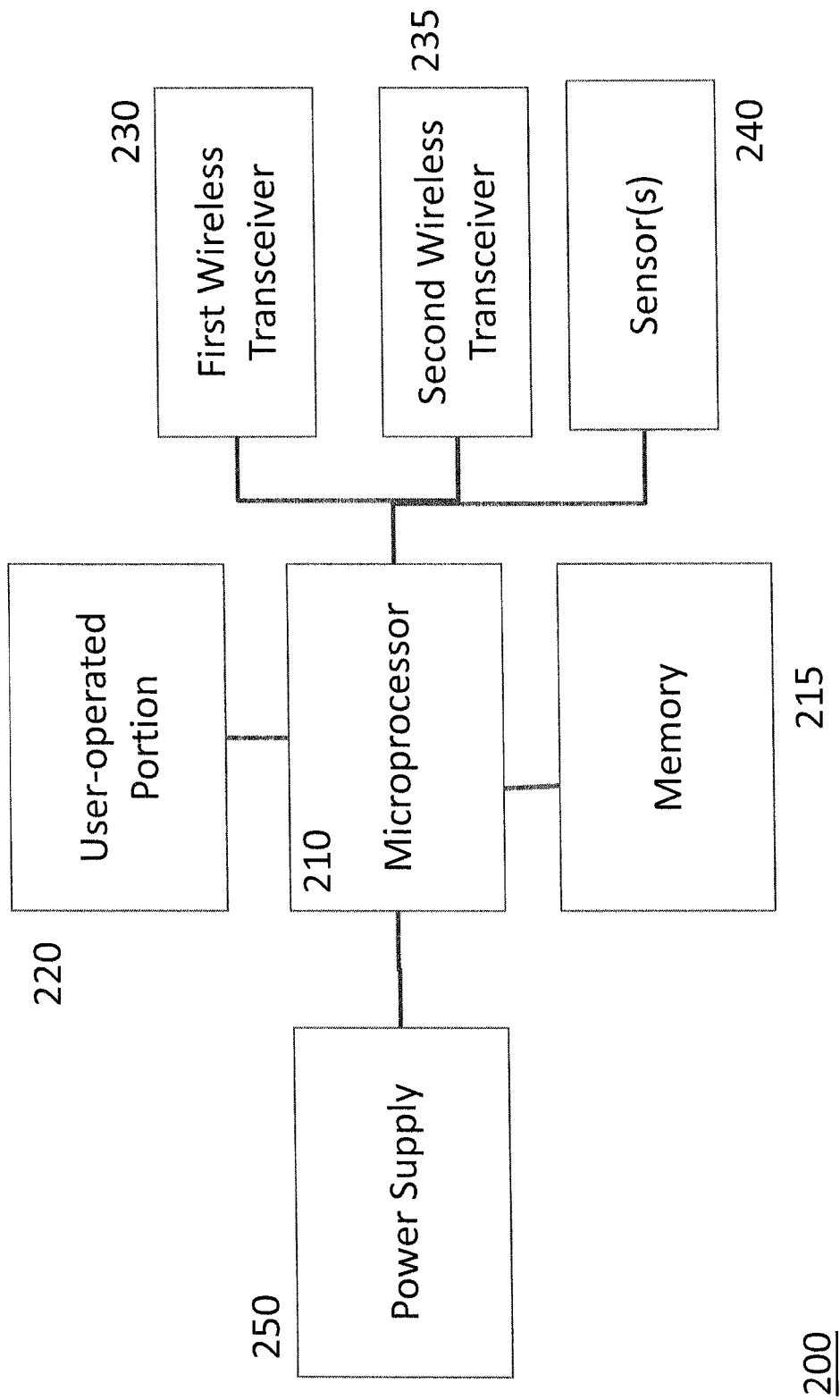
FIG. 2 schematically illustrates an exemplary switch, in accordance with an embodiment of the present disclosure.

FIG. 2 shows a block diagram for a switch 200 that may be used in the automation system 100 and may operate as the switch 120 in FIG. 1. Switch 200 may be any suitable actuator known in the art. In at least some embodiments, the switch 200 may be remotely controlled. The switch 200 may include a microprocessor 210 capable of running software or an algorithm stored in memory 215. Memory 215 may be, e.g., solid state or flash memory, or any other suitable type of memory. The switch 200 may include a user-operated portion 220, such as a mechanical lever. In some embodiments, the switch 200 includes one or more user input devices, including, for example, a touch sensor, a touch screen, and/or push buttons.

User-operated portion 220 may be configured to control (e.g., interrupt, adjust, change, terminate, and/or meter) the supply of energy to or from a device or an outlet (e.g., outlet 130 shown in FIG. 1) in communication with switch 200. In at least some embodiments, the user-operated portion 220 is configured to control the supply of electrical energy to a device or outlet 130. Accordingly, in one embodiment, the user-operated portion 220 may be configured to transition between an "on" position and an "off" position (i.e., supplying and terminating power, respectively). In another embodiment, the switch 200 may allow various levels to be controlled by the user discretely or continuously (e.g., increasing or decreasing power supply). That is, user-operated portion 220 may be configured to provide a dimming function or otherwise vary one of the voltage and the current of the electrical power supplied to outlet 130.

The switch 200 may further include a first wireless transceiver 230, for example, a 802.11 Wi-Fi transceiver. The term "transceiver" as used herein should not be construed as limited to any particular structural components. Instead, a transceiver may include any structural components configured to allow for back and forth communication, e.g., communication exchange. Accordingly, the transceivers disclosed herein may include, but are not limited to, antennae, power supplies, communication ports, and/or any other elements needed to achieve the desired function. The first wireless transceiver 230 may be configured to communicate over any known protocol including, but not limited to, X10, Zigbee®, and/or Bluetooth. Further, although the exemplary embodiment of FIG. 2 depicts the transceiver 230 as a wireless transceiver, those of ordinary skill will readily recognize that first wireless transceiver 230 may be replaced with a wired communication mode. First wireless transceiver 230 may allow the switch 200 to communicate with a control device, e.g., the control unit 110 as shown in FIG. 1. The first wireless transceiver 230 therefore may allow the switch 200 to exchange one or more commands with the control unit 110 of the automation system 100.

In some embodiments, the switch 200 may also include a second wireless transceiver 235 to allow the switch 200 to communicate with one or more devices (e.g., the outlet 130 shown in FIG. 1 and/or any electrical load coupled thereto) using multiple standards. Both transceivers 230 and 235 may include received signal-strength indicator means to identify the strength of a signal received by the transceiver. The first and second wireless transceivers 230, 235, respectively, may allow for communication over one or more protocols, including, but not limited to, the aforementioned protocols. In addition, the first wireless transceiver 230 may be configured to communicate over a protocol that is different from the communication protocol of the second wireless transceiver 235.

The switch 200 may include one or more sensors 240 configured to detect and/or respond to various conditions or stimuli, such as temperature, moisture (e.g., water, rain, or humidity), light, sound, air flow, contaminants, motion, and/or electromagnetic or radio frequencies. Examples of such sensors 240 are disclosed in U.S. application Ser. No. 13/672,534, filed on Nov. 8, 2012, which is incorporated herein by reference. The sensor(s) may include a camera, imager, and/or IR sensor. The sensor(s) may be used to detect and/or identify persons, animals, and/or objects in the vicinity of the switch 200 and may be used to determine the identity of a person actuating a switch 200. Data from the sensor(s) 240 may be processed in the switch 200 and/or via another device coupled to system 100. The processing may include comparing the sensor data to sensor data stored locally or remotely in a database to determine an identity, such as the identity of the most likely person to be in the vicinity of the switch 200, or the most likely person to actuate the switch 200. The sensor may include an algorithm or other software to identify a person, e.g., via physical characteristics, such as facial recognition or fingerprint, or auditory characteristics, such as voice recognition, or may communicate with one or more other components of system 100 to identify a person through physical and/or auditory characteristics detected by the sensor.

The sensor data may be sampled at a periodic or aperiodic rate, which may increase in response to stimuli (e.g., if one or more persons are in the vicinity of the switch 200) and decrease in the absence of stimuli (e.g., when persons are not in the vicinity of the switch 200). The sensor may sample, e.g., collect, store, and/or display, data upon actuation of the switch 200.

One or more transceivers (e.g., first wireless transceiver 230 and/or second wireless transceiver 235) may communicate with a device associated with (e.g., carried by) a person, such as a mobile device 170, e.g., a smartphone. By communicating with mobile device 170 and/or by monitoring a signal emitted from mobile device 170, switch 200 may determine that mobile device 170 is near the switch 200. This may be determined by any suitable means, such as, e.g., by measuring the strength of the signal emitted by mobile device 170, by measuring the time delay of a message to or from mobile device 170, or by other means known in the art. One or more components of system 100 may recognize an association between mobile device 170 and one or more persons, for example, and thereby system 100 may associate mobile device 170 with a particular person or operator. If switch 200 detects that mobile device 170 is in the vicinity of the switch 200, then system 100 may determine or otherwise understand that the owner or operator of mobile device 170 is also in the vicinity of switch 200.

The switch 200 may include a power supply 250, which may be any suitable power supply known in the art. In some embodiments, for example, the power supply 250 includes a battery, e.g., a rechargeable battery. It is understood that the power supply 250 in FIG. 2 may schematically illustrate a wired or wireless connection to a power network, such as, e.g., a power grid or transformer. Further, the power supply 250 may include both a battery and a connection to a power network. The sensor may allow at least one of the voltage and current to be measured at connection 350.

The switch 200 may include a microprocessor 210, which may be any suitable microprocessor known in the art. Although FIG. 2 shows the microprocessor 210 located within the switch 200, in some embodiments the microprocessor 210 may be remotely connected to the switch 200. The microprocessor 210 may be configured to communicate, e.g., exchange control signals, with the one or more sensors 240, the first wireless transceiver 230, the second wireless transceiver 235, and/or the user-operated portion 220 of switch 200.

Figure 3:
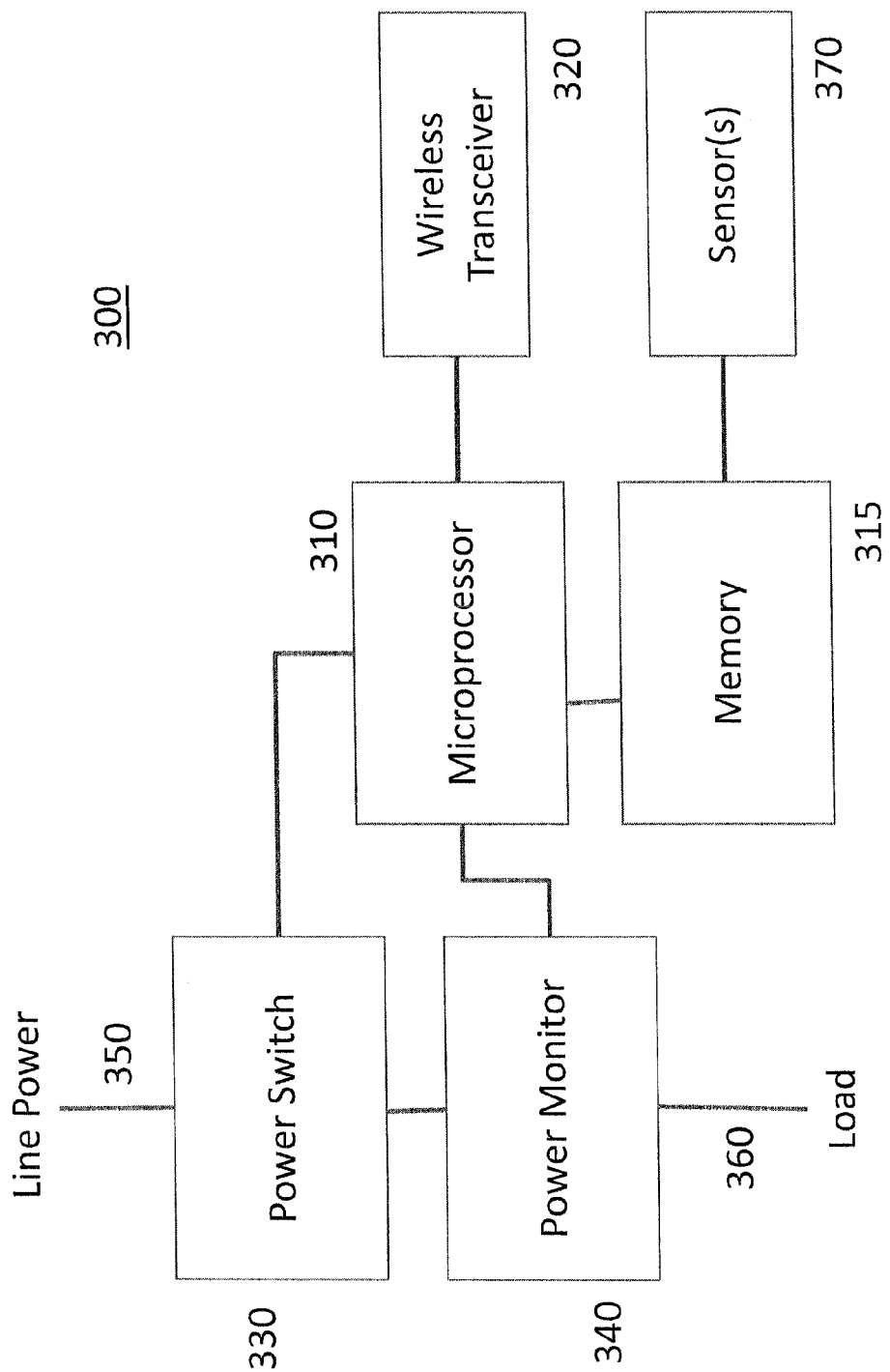
FIG. 3 schematically illustrates an exemplary outlet, in accordance with an embodiment of the present disclosure.

FIG. 3 shows a block diagram of an outlet 300 that may operate as the outlet 130 of the system 100 shown in FIG. 1. In at least some embodiments, the outlet 300 is remotely controlled. The outlet 300 may include a microprocessor 310 that runs software or an algorithm stored in memory 315. The microprocessor may be remotely connected to outlet 200. The outlet 300 further may include a transceiver 320, which may include any of the features described in connection with transceivers 230 and 235 of FIG. 2. The outlet 300 also may include one or more sensors 370, which can include, e.g., motion sensors, voltage sensors, current meters, ambient light sensors, cameras, microphones, moisture sensors, or any of the sensors described above with respect to the one or more sensors 240 of FIG. 2. The sensors may allow at least one of the voltage and current to be measured at connection 350 with a source of electrical energy.

In some embodiments, the outlet 300 receives electrical energy via a power switch 330 supplied by line power via connection 350. The power switch 330 may be controlled by a microprocessor, e.g., microprocessor 310, which may include any of the features described with respect to the microprocessor 210 of FIG. 2. The power switch 330 may be configured to connect and/or disconnect the line power to the outlet 300, including a connected load 360 (e.g., one or more electrical devices coupled to the outlet 300). The power switch 330 also may be configured to vary (e.g., increase, reduce, or otherwise control) a voltage or current delivered to the load 360, thus providing a dimming function.

The outlet 300 may further include a power monitor 340 for measuring the consumption of power by the load 360 connected to the outlet 300. The power monitor 340 may measure voltage and/or may measure current of the electrical energy delivered to the load 360, and this may include for example, measuring average values, RMS values, or sampling the waveform of the measured characteristic. The load 360 may be connected via any suitable means, such as, e.g., standard 2 or 3 pin power outlets, 220V outlets, or international standard outlets, and may also include a wireless connection such as via a wireless charger. The power meter/monitor 340 may transmit measured power data to the microprocessor 310 via the transceiver 320, or may also transmit data to one or more other components or devices of the system 100.

In some embodiments, the power monitor 340 measures noise in the connection to the load 360 in order to determine the type of energy-consuming device(s) connected to outlet 300. See, e.g., U.S. application Ser. No. 13/672,534, which is incorporated herein by reference. This type of analysis is discussed, for example, in U.S. Pat. No. 8,094,034. Multiple connections throughout an entire structure may be monitored and analyzed to determine the types of devices, such as appliances, connected to define the load 360, e.g., by turning the devices on and off. In some embodiments, user activity may be inferred by monitoring a structure, e.g., identifying which loads are activated and deactivated. By monitoring power consumption characteristics of the load 360, one or more characteristics of a device connected to the outlet 300 may be determined, e.g., via techniques disclosed in U.S. Pat. No. 8,094,034 or other suitable analytical methods. Based on the power consumption characteristic(s), the device (e.g., an oven, refrigerator, fan, or other appliance) may be beneficially and intelligently identified and controlled.

In some embodiments, the outlet 300 may be connected to an appliance at 360 (i.e., an appliance as the load 360). The appliance may have a power switch similar to power switch 330 of the outlet 300 to turn the appliance on or off and/or to place the appliance in an intermediate state, such as dimming, standby, or another state of reduced energy consumption. The appliance power switch 330 may control power to the appliance, e.g., supply and/or terminate or disable power to the appliance. In one embodiment the power switch 330 may be composed of a relay and a TRIAC (Triode for Alternating Current) configured generally in parallel. The TRIAC may be used to provide a dimming function, by reducing the power provided to an appliance. The relay may also be used to provide power to an appliance or device connected to 360.

In some embodiments, the outlet 300 may monitor the state of the appliance to determine if the appliance power switch has been actuated. One method of determining actuation of the appliance power switch is to measure the resistance of the appliance, i.e., the resistance of the load 360 connected to the outlet 300. For example, a relatively small amount of electrical current or voltage may be supplied to the appliance, and resistance may be measured, e.g., with an ohmmeter or other suitable device. If the appliance power switch is set to turn the appliance on, the appliance may present a relatively low impedance to the supplied current/voltage, whereas if the power switch is set to turn the appliance off, the appliance may present a relatively high impedance. By measuring the impedance of the load 360, the outlet 300 may determine the state of the appliance power switch and determine if the state of the switch has changed.

The outlet 300 may have electrical and/or mechanical capability of determining whether a plug is connected to a socket of the outlet 300. For example, the outlet 300 may include an electrical sensor and/or mechanical mechanism for detecting a connection or otherwise detecting the presence of a plug within or otherwise coupled to outlet 300. Such sensors may include, but are not limited to, proximity sensors, mechanical switches, imagers, cameras, etc. Further, the outlet 300 may include an RF sensor for detecting an RF signal emitted by a plug, e.g., if the plug is sufficiently close to the outlet 300. Other suitable means of detecting and/or identifying whether an appliance or other device is connected to the outlet 300 will be known to those of ordinary skill in the art.

If the outlet 300 recognizes or detects a connection, e.g., determines that a plug is connected to the socket of outlet 300 or detects a wireless connection to an appliance, the outlet 300 may monitor the state or condition of the appliance, e.g., whether the appliance is turned on or turned off. In some embodiments, for example, the outlet 300 may monitor the appliance continuously for a change in state.

In some embodiments, the outlet 300 may monitor whether an appliance operably coupled to outlet 300 is turned on, turned off, or placed in an intermediate state when a person is determined to be in the vicinity of the appliance. For example, the outlet 300 may include a sensor 370 that may determine that a person is in a given area or radius of the appliance. Alternatively, or in addition, a sensor otherwise connected to the automation system 100 such as sensor 240 may determine that a person is in the area of the appliance. For example, a person may be in the same room as the appliance, in the same house or structure as the appliance, or within a certain predetermined distance of the appliance, such as, for example, from about 1-10 feet, e.g., within about 3 feet or 5 feet. The presence of a person may be determined by any suitable method, including, but not limited to, a motion sensor, a camera, or the presence of a mobile device, e.g., mobile device 170. In some embodiments, for example, the automation system 100 may determine the presence or identity of a person by determining the location of a mobile device 170. In other embodiments, the automation system 100 may detect the presence of a person by detecting one or more other components of the system 100 being turned on, turned off, or otherwise adjusted in a given area. For example, the system 100 may detect a light being turned on and determine that a person is near the light. If no one is detected within the vicinity of the appliance, the outlet 300 may not conduct any monitoring, or may monitor the appliance periodically.

In some embodiments, system 100 may send instructions to one or more components of system 100 to detect and/or identify a person. For example, if a switch 200 is known to be near outlet 300 and/or another device of system 100, and if any of the devices detect the presence of a person, the system 100 may send instructions via switch 200 to one or more devices in the vicinity, e.g., all devices in the vicinity of the person may attempt to detect and identify the person. In some embodiments, system 100 may send instructions directly to one or more devices in the vicinity of the person to detect and identify the person.

In some embodiments, for example, the outlet 300 may periodically check if a power switch on the appliance has been actuated. For example, the outlet 300 may monitor the appliance every 5 minutes, 10 minutes, 15 minutes, 30 minutes, 1 hour, 2 hours, 6 hours, 12 hours, 24 hours, or at any suitable interval, for a change in state. The periodicity may be adjusted depending on the time of day, the presence of a person, motions or other activity of a person, and/or other inputs to the automation system 100. For example, an outlet 300 may have an appliance plugged in, wherein initially power is not supplied to the appliance. When the appliance is switched on, the outlet 300 may monitor the state of the appliance continuously, or the outlet 300 may monitor the state of the appliance periodically, such as every 5 minutes. If a person is determined to be in the vicinity of the appliance and not moving, the outlet 300 may, for example, monitor the appliance every 5, 10, 15, 20, 25, 30, 45, or 60 seconds. If the person in the vicinity of the appliance is moving, however, the outlet 300 may monitor the appliance more frequently, such as every 1 second.

If the outlet 300 does not determine that an appliance or other device is connected, e.g., plugged into the socket or otherwise connected wirelessly, the outlet 300 may not conduct any monitoring. The outlet 300 may periodically check to determine whether an appliance is connected, e.g., electrically and/or mechanically, as discussed above.

The outlet 300 may comprise a device that is included in a junction box or coupled to an electrical system, e.g., to provide power to another utility or device. By way of example, this could be a device included in a ceiling junction box that is coupled (e.g., wired) to, e.g., a ceiling fan, a device included inline to power outside flood lights, a device that monitors and/or controls the flow of natural gas to a furnace, among other variations.

In further embodiments, outlet 300 may be configured to selectively control the electrical energy delivered to a load 360 coupled thereto. That is, outlet 300 may be configured to vary the current or voltage delivered to a load 360. In order to perform such variations, or provide a dimming function, outlet 300 may include one or more TRIACS and relays in a circuit, e.g., parallel. As those of ordinary skill in the art will understand, the TRIAC may be provided to facilitate the dimming function, by, e.g., varying voltage, while the relay may facilitate routine on/off functionality.

Figure 4:
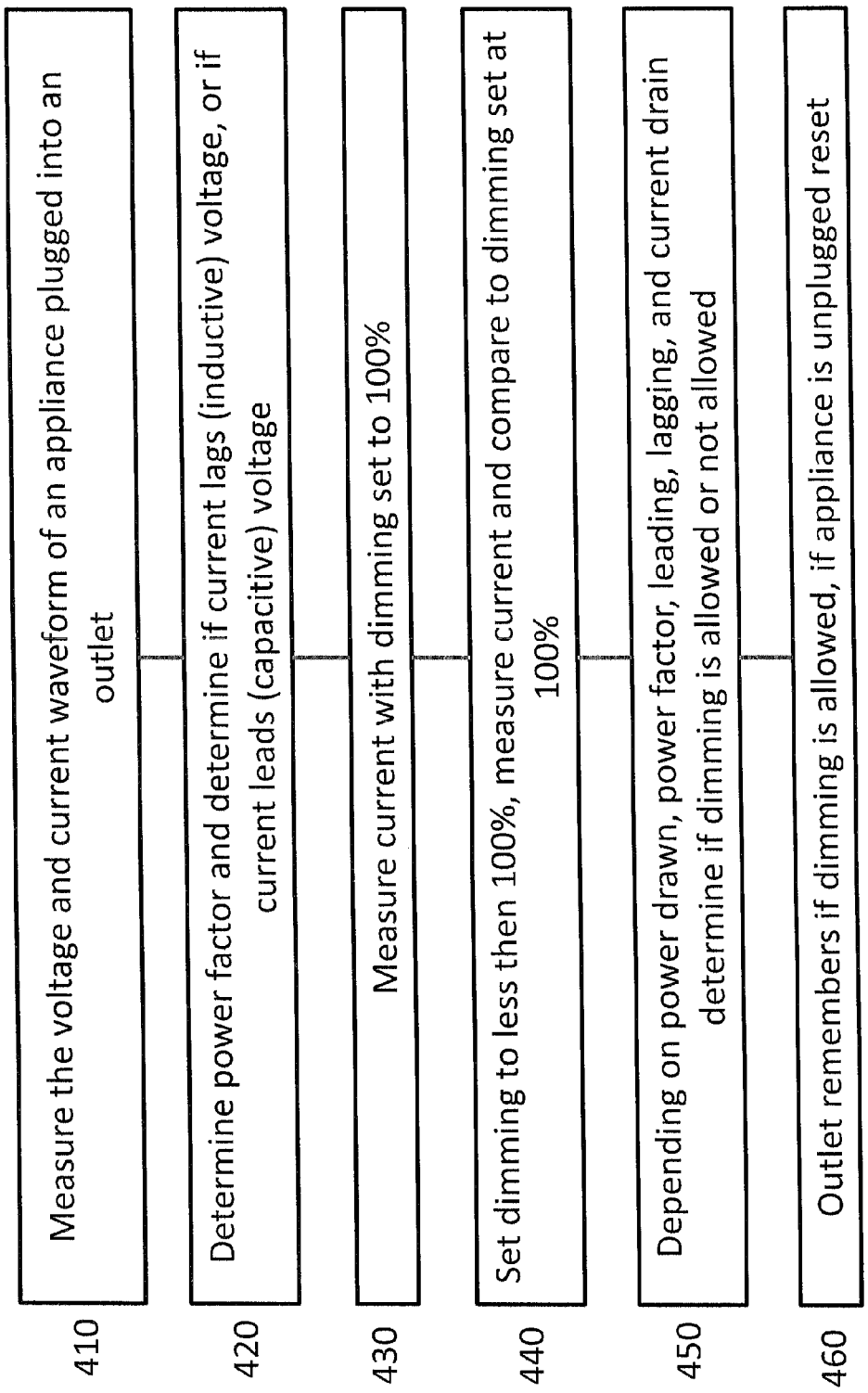
FIG. 4 depicts a flow diagram of an exemplary method, in accordance with an embodiment of the present disclosure.

Turning now to FIG. 4, a flowchart is shown to depict an exemplary method 400 of determining whether an electrical device or component may tolerate variations in supplied electrical energy or power without compromising desired performance. However, those of ordinary skill in the art will recognize that the principles of the present disclosure contemplate any suitable methods or mechanisms of allowing automation system 100 to determine whether an electrical device or component can tolerate variations in supplied electrical energy without compromising desired performance. Such methods also include programming or otherwise indicating/instructing automation system 100 that one or more electrical devices/components should not be dimmed. Further, automation system 100 may be capable of obtaining one or more characteristics of an electrical device/component from one or more sensors, and comparing the obtained characteristics to a database of electrical devices/components unable to tolerate dimming functions.

Further, automation system 100 may be configured to communicate directly with one or more electrical devices/components to determine whether the device/component is of the type that can tolerate variations in supplied electrical energy. For example, a plug of a vacuum cleaner may include an embedded microchip configured to emit a signal containing instructions indicating that the vacuum cleaner should receive a continuous supply of electrical energy. Each outlet 300 in a structure may include a receiver configured to receive the signal and decipher the microchip's instructions. Once the plug is received in a particular outlet 300, and the outlet 300 has received the microchip's instructions, automation system 100 may evaluate the instructions, and make a determination whether the electrical energy supplied to that particular outlet 300 may be varied or not. If not, any previous dimming instruction may be overridden to prevent malfunction of the vacuum cleaner during use, for example.

In one aspect of the disclosed method, an outlet or other suitable power delivery device, such as, e.g., an outlet 300, may measure the voltage and/or current waveform of electrical energy drawn by an appliance operably coupled to the outlet 300, step 410. Measurements may be made in any suitable manner known in the art. For example, as described above, each outlet 300 may include a power monitor 340 configured to monitor or otherwise measure one or more characteristics of the electrical energy supplied by outlet 300 to the appliance coupled thereto. In some embodiments, information relating to the characteristics of the electrical energy drawn by an appliance coupled to an outlet 300 may be directly communicated from the appliance to outlet 300 or system 100 via, e.g., the microchip/receiver combination discussed above. Still further, information relating to the characteristics of the electrical energy drawn may be manually entered into system 100 via a suitable user interface (not shown).

Turning now to step 420, control unit 110 may be configured to perform one or more calculations or otherwise analyze the received information relating to the characteristics of the electrical energy drawn by the appliance coupled to outlet 300. More particularly, the current and voltage waveforms may be analyzed by control unit 110 to determine, among other things, the power factor of the load provided by the appliance. As those of ordinary skill in the art will understand, the power factor of a load includes the cosine of the angle between the current and voltage waveforms. Further, if the current waveform leads the voltage waveform, the load may be referred to as a capacitive load. If, however, the current waveform lags the voltage waveform the load may be referred to as an inductive load. If it is indeed determined that the current lags the voltage waveform for a particular appliance, the appliance may be determined to not tolerate dimming without calculating the power factor. As those of ordinary skill in the art will understand power factor is defined as the ratio of real power flowing to a load, to the apparent power in the circuit. See, e.g., en.wikipedia.org/wiki/Power_factor.

Next, measurements of the current drawn by the appliance may be made while the appliance is drawing electrical energy at a first level, such as, e.g., a full level, step 430. For example, the power monitor 340 may measure the electrical current drawn by the appliance coupled to outlet 300 while a maximum level of electrical energy is supplied to the appliance. The maximum level of electrical energy supplied to the appliance may correlate to a recommended level or a level of energy that does not include any variations due to dimming functions. Subsequently, the power monitor 340 may again measure the electrical current drawn by the appliance coupled to outlet 300 while electrical energy is delivered at a second level different than the first level, step 440. For example, the electrical energy delivered to the appliance may be reduced by, e.g., executing a dimming function. The second level may be, e.g., 90% of the first level. In another embodiment, the second level may be 70% or even 50% of the first level. Those of ordinary skill in the art will understand that any suitable number of current measurements may be made at any suitable level of delivered electrical energy.

Subsequently, control unit 110 of system 100 may analyze the various current measurements and make a determination (e.g., automatically) whether the appliance coupled to outlet 300 may tolerate variations in supplied electrical energy without compromising desired performance. Specifically in step 450, a determination may be made that the appliance cannot be dimmed or otherwise tolerate variations in supplied electrical energy if it is observed that the current drawn by the appliance measured in step 430 is lower then the current drawn by the device measured in step 440.

In addition, a determination may be based on whether the power factor is leading or lagging, as discussed above. For example, a determination may be made that the appliance cannot be dimmed if the current waveform lags (and/or leads) the voltage waveform. That is, a determination may be made that the appliance cannot be dimmed if the power factor is less than a threshold, such as, e.g., 1.0 (i.e., the power factor of a linear load), or if the power factor is less than 0.7. The target power factor may be a fixed number or may be variable depending on time. The target may be loaded to the control device from another device in system 100 or the target may originate from a server in the Internet cloud 140.

Once it is determined that a particular appliance coupled to an outlet 300 may be dimmed or otherwise safely tolerate variations in supplied electrical power, system 100 may reduce the electrical energy delivered to that appliance as desired, or according to a particular set of instructions. Any prior instructions received by the outlet 300 to vary electrical energy delivered to the outlet 300 may be ignored by the outlet 300 if the appliance currently coupled to outlet 300 is unable to be dimmed or otherwise safely tolerate variations in supplied electrical power. If an appliance is unplugged from an outlet 300, outlet 300 may be configured to clear any pre-existing instruction or programming (e.g., restrictions on dimming) (step 460) and may make another determination for the next appliance that is plugged into or otherwise coupled the outlet 300.

In one embodiment, once a determination has been made that an appliance should not be dimmed or otherwise experience a reduction in electrical energy, a device of automation system 100 may monitor for a brown out condition. A brown out occurs if the power plant 101 or distribution grid 122 is unable to deliver sufficient electrical energy to a location. When this occurs, the voltage at the location fluctuates and falls below the typical values. If a brown out occurs, a home automation system may discontinue delivering electrical power to appliances that have been determined not to tolerate dimming. The electrical power may be disabled by turning off, for example, power switch 330 in the outlet that the appliance in question is connected to. When electrical power delivered to the location returns to normal, the home automation system may restore electrical power to the appliance by enabling the power switch 330 in the outlet the appliance is connected to, or the home automation system may wait for a user instruction to turn the appliance back on.

For those appliances unable to tolerate variations in supplied electrical energy, a memory (e.g., a solid state or flash memory) operably coupled to outlet 300 may be configured store an identity of the appliance, so future determinations need not be made if the appliance is again coupled to a particular outlet 300.

With reference now to FIG. 5, a flowchart depicts a method 500 of determining whether an electrical component, such as, e.g., a relay or a TRIAC (Triode for Alternating Current), may be operating incorrectly. It is contemplated that method 500 may be used to evaluate the possibility of failure for components, such as, e.g., dimmers, including at least one relay (e.g., an electrically operated switch controlled by a solenoid) in parallel with at least one TRIAC. It is contemplated that such dimmers may be included in at least one outlet 300 so as to vary the electrical energy supplied to a coupled load, as discussed above.

In one embodiment the TRIAC may not be sized sufficiently large to enable the TRIAC to support all the current that a load may require. By providing a relay substantially in parallel to the TRIAC, the relay can short the TRIAC out and source large currents that the load requires but the TRIAC cannot support. If the TRIAC is not able to turn off due to a malfunction, the TRIAC may overheat. By determining that the TRIAC is malfunctioning the relay can be left in the closed position preventing the TRIAC from overheating.

In one embodiment, method 500 may include interrupting the power supplied to an outlet 300. For example, with reference to FIG. 3, power switch 330 of outlet 300 may be operated to interrupt line power 350 by turning off a TRIAC and opening a relay. With the power supply to load 360 interrupted, method 500 includes measuring at least one of the current and voltage delivered to load 360 (e.g., an appliance), step 510. If no current or voltage measurements are made, a determination may be made that all components are functioning within acceptable parameters.

If, however, the measurements indicate that electrical energy (e.g., current or voltage) is flowing to load 360, it may be determined that one of the TRIAC and/or relay is malfunctioning, step 520. That is, the control circuitry to the relay or TRIAC may have failed and left in an "on", or partially "on" position.

In step 530, after a failed condition is determined, the relay may be closed and left in a closed position. With the relay closed, the TRIAC would be shorted out, preventing the TRIAC from dissipating any power. The outlet 300 may then communicate with, e.g., control unit 110 of automation system 100 that the fault has occurred. The outlet 300 may ignore any commands to open the relay or resume power delivery through outlet 300 until the fault is corrected.

Figure 6:
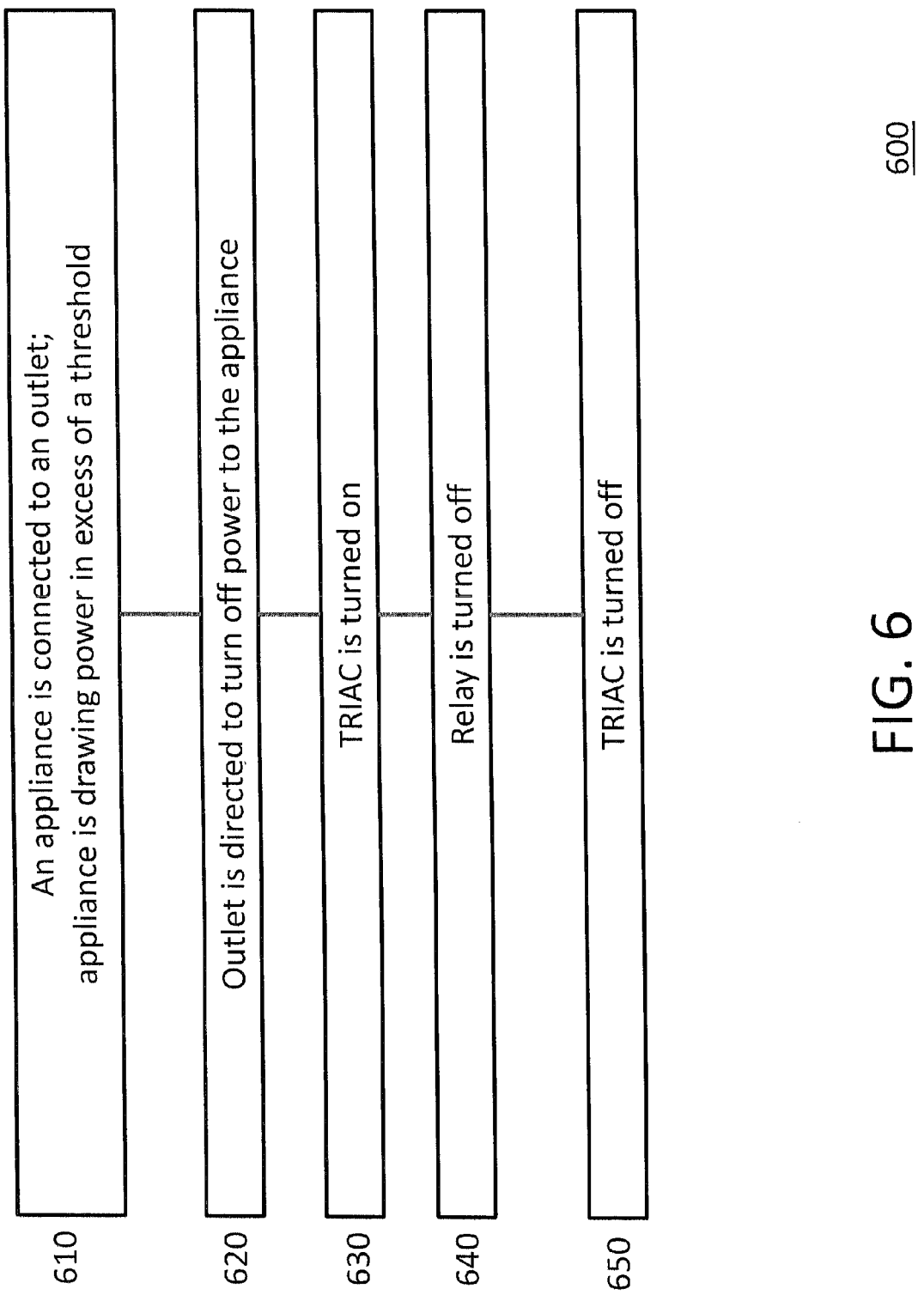
FIG. 6 depicts a flow diagram for an exemplary method of interrupting the flow of electrical energy to a device.
Figure 7:
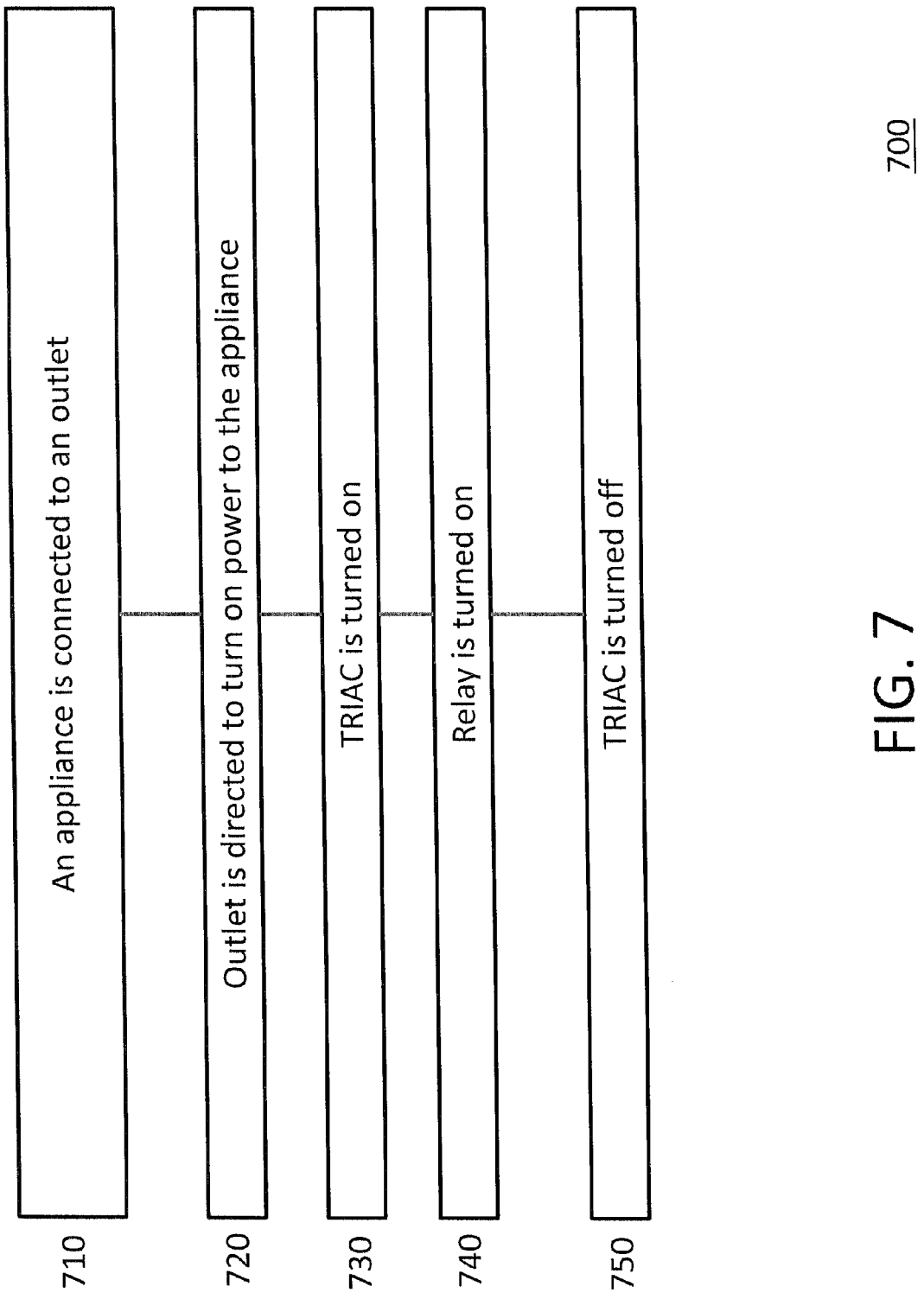
FIG. 7 depicts a flow diagram for an exemplary method of permitting or reinstating the flow of electrical energy to a device.

Turning now to FIGS. 6-7, flowcharts depict exemplary methods 600, 700 of reducing the electrical energy traveling through a relay to, e.g., minimize malfunction by eliminating the possibility of current arcing across corresponding relay contacts when the relay is opened or closed. As those of ordinary skill will understand, a visible spark typically appears between corresponding relay contacts as soon as they are moved out of contact, or just prior to contact, with one another. The spark may lead to damage of the relay contacts.

FIG. 6 shows a method 600 of disconnecting power to a device or an appliance coupled to an outlet 300. In step 610, the method includes an appliance connected to an outlet 300 and the appliance may be drawing power from the outlet 300. The power drawn may be in excess of a first predetermined threshold, such as, e.g., 500 W.

In step 620, automation system 100 may instruct outlet 300 to cease or otherwise interrupt power delivery to the appliance. If power delivery is interrupted while the appliance is drawing a relatively high level of power, e.g., 500 W, the relay may experience damage, as discussed above.

To avoid damage to the relay, method 600 includes turning on a TRIAC of outlet 300, step 630. With the TRIAC on, and some electrical energy flowing through the TRIAC, the relay may be then safely turned off, step 640. At this point the electrical energy passes through the TRIAC, eliminating or greatly reducing stress to the relay for switching a large load.

In step 650, the TRIAC may be returned to the off position. It is expected that the time between turning off the relay in step 640 and turning off the TRIAC in step 650 may be relatively small to prevent damage to the TRIAC. In one embodiment, the time between turning off the relay and turning off the TRIAC is less then 50 mS.

In some embodiments, the relay may be turned off directly without first enabling the TRIAC if the power drawn by the appliance is in excess of a second threshold, where the second threshold exceeds the first threshold.

Turning now to FIG. 7, there is depicted a method 700 to enable delivery of electrical energy to an appliance coupled to an outlet 300. In step 710, an appliance may be connected to an outlet but not drawing power. The appliance may have been identified from previous power consumption while connected to the outlet. During previous operation, the automation system 100 may have monitored via, for example, a power monitor 340 the power drawn by an exemplary appliance. The information, or information from any of the multitude of sensors connected to automation system 100, may be used to identify the appliance as has been discussed above. From the identity of the appliance, the automation system 100 may determine that the appliance will draw current in excess of a threshold when the appliance turns on. The power monitor 340 of the outlet that the appliance is connected to may also measure the power consumed by the appliance when the appliance turns on and may determine that the appliance draws electrical energy in excess of a threshold when the device turns on.

In step 720, with the relay in an open position, the outlet may be directed to enable delivery of electrical energy to the appliance coupled to the outlet 300. If the appliance is known to draw current in excess of a threshold when turned on, then operation continues to step 730. If the appliance is known to draw current below a threshold when turned on, then the relay may be closed and power delivery may be enabled.

If, however, the appliance's power consumption is known to be greater than a predetermined threshold, step 730 may include turning on a TRIAC so as enable the appliance to begin receiving delivery of electrical energy. Subsequently, a relay may be turned on (i.e., closed), so that electrical energy delivery may continue, step 740. It is contemplated that the time between turning on the TRIAC and closing the relay may be relatively short. In one embodiment the time between turning on the TRIAC and closing the relay should be less then 50 mS. Further, the TRIAC may be returned to the off position once electrical energy is being delivered through the relay, step 750. By turning on the TRIAC first, the inrush current consumed by the appliance is first sourced by the TRIAC, reducing the opportunity for damage to the relay. After current is flowing to the appliance, the relay is turned on substantially in parallel to the TRIAC, and then the TRIAC is disabled. The TRIAC may not be capable of delivering the required power to the appliance long term without over heating and suffering damage, however, the TRIAC would be able to support delivering power to the appliance for a short period of time.

It is understood that the present disclosure is not limited to the particular forms, embodiments and examples illustrated. The method and apparatus of the disclosure can be practiced with and modifications and variations that do not depart from the spirit and scope of the disclosure.

Embodiments of the present disclosure may be used in connection with any structure, including, but not limited to, homes, offices, businesses, schools, churches, sporting complexes, hospitals, shopping centers, and manufacturing facilities. In addition, at least certain aspects of the aforementioned embodiments may be combined with other aspects of the embodiments, or removed, without departing from the scope of the disclosure.

Other embodiments of the present disclosure will be apparent to those skilled in the art from consideration of the specification and practice of the embodiments disclosed herein. It is intended that the specification and examples be considered as exemplary only, with a true scope and spirit of the disclosure being indicated by the following claims.

We claim:

1. A method of determining whether an electrical appliance can tolerate variations in supplied electrical energy, the method comprising:
   coupling the electrical appliance to a source of electrical energy;
   delivering electrical energy to the electrical appliance, wherein the electrical energy is delivered at a first electrical energy level;
   obtaining a first measurement of current consumed by the electrical appliance at the first electrical energy level;
   delivering electrical energy to the electrical appliance at a second electrical energy level different than the first electrical energy level;
   obtaining a second measurement of current consumed by the electrical appliance at the second electrical energy level;
   comparing the first measurement of current to the second measurement of current; and
   controlling or varying the electrical power delivered to the electrical appliance based on the result of the comparison.

2. The method of claim 1, wherein the second electrical energy level is less than the first electrical energy level.

3. The method of claim 1, wherein comparing the first measurement of current to the second measurement of current includes determining whether the second measurement of current is greater or less than the first measurement of current.

4. The method of claim 3, wherein, if the second current is less than first current, maintaining delivery of constant electrical energy to the electrical appliance.

5. The method of claim 1, wherein, if the first current is substantially similar to the second current, reducing an electrical energy delivered to the electrical appliance.

6. The method of claim 1, wherein the source of electrical energy includes a power delivery device including at least one TRIAC and relay.

7. The method of claim 6, wherein the power delivery device is in communication with an automation system, wherein the automation system includes a processor configured to perform the comparing.

8. The method of claim 6, wherein the automation system includes a memory stores an electrical tolerance data of the appliance.

9. A method of determining whether an electrical appliance can tolerate variations in supplied electrical energy, the method comprising:
   coupling the electrical appliance to a source of electrical energy;
   delivering electrical energy to the electrical appliance;
   monitoring the electrical energy delivered to the electrical appliance;
   analyzing the electrical energy delivered to the electrical appliance to identify a current waveform and a voltage waveform;

analyzing the identified current and voltage waveforms, and controlling or varying the electrical energy delivered to the appliance based on the analysis; wherein a power delivery device will reduce the electrical energy supplied to the appliance upon command, only if the analyzing has indicated that the appliance can operate with reduced electrical energy.

10. The method of claim 9, wherein analyzing the identified current and voltage waveforms includes determining one of: (1) a power factor, (2) whether the current waveform leads the voltage waveform, and (3) whether the voltage waveform leads the current waveform.

11. The method of claim 10, further comprising, if the power factor is below a predetermined threshold, reducing a voltage delivered to the electrical appliance.

12. The method of claim 11, wherein the predetermined threshold is 1.0.

13. The method of claim 12, wherein the predetermined threshold is 0.7.

14. The method of claim 10, wherein, if the power factor is above a predetermined threshold, maintaining delivery of constant voltage to the electrical appliance.

15. The method of claim 9, wherein the source of electrical energy is in communication with an automation system, wherein the automation system includes a processor configured to perform the analyzing steps.

16. An automation system, comprising:
a power delivery device, wherein the power delivery device includes at least one sensor for measuring electrical energy supplied by the power delivery device to an appliance, and wherein the power delivery device is configured to vary a voltage supplied by the power delivery device; and
a control unit having a processor including a memory, that is operably coupled to the power delivery device;
wherein the control unit is configured to determine whether the appliance coupled to the outlet can tolerate variations in supplied electrical energy without compromising desired performance.

17. The automation system of claim 16, wherein determining whether the appliance coupled to the outlet can tolerate variations in supplied electrical energy comprises:
measuring a first current consumed by the electrical appliance at the first electrical energy level;
delivering electrical energy to the electrical appliance at a second level different than the first level;
measuring a second current consumed by the electrical appliance at the second electrical energy level;
comparing the first current to the second current; and
controlling or varying the electrical power delivered to the electrical appliance based on the result of the comparison.

18. The automation system of claim 16, wherein determining whether an appliance coupled to the outlet can tolerate variations in supplied electrical energy comprises:
coupling the electrical appliance to a source of electrical energy;
delivering electrical energy to the electrical appliance;
monitoring the electrical energy delivered to the electrical appliance;
analyzing the electrical energy delivered to the electrical appliance to identify a current waveform and a voltage waveform; and
analyzing the identified current and voltage waveforms.

19. The automation system of claim 16, wherein the power delivery device is an electrical outlet.

* * * * *